US010164149B1

(12) United States Patent
Yoo et al.

(10) Patent No.: US 10,164,149 B1
(45) Date of Patent: *Dec. 25, 2018

(54) LED PANEL

(71) Applicant: LUMENS CO., LTD., Yongin-si, Gyeonggi-do (KR)

(72) Inventors: Taekyung Yoo, Yongin-si (KR); Daewon Kim, Yongin-si (KR); Yelim Won, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/960,514

(22) Filed: Apr. 23, 2018

Related U.S. Application Data

(63) Continuation of application No. 15/857,544, filed on Dec. 28, 2017, now Pat. No. 9,985,175.

(30) Foreign Application Priority Data

Jun. 27, 2017 (KR) .......................... 10-2017-0080881

(51) Int. Cl.
| | |
|---|---|
| G01D 11/28 | (2006.01) |
| H01L 33/08 | (2010.01) |
| H01L 33/50 | (2010.01) |
| H01L 33/38 | (2010.01) |
| H01L 33/12 | (2010.01) |
| H01L 23/00 | (2006.01) |

(52) U.S. Cl.
CPC .............. *H01L 33/08* (2013.01); *H01L 24/17* (2013.01); *H01L 33/12* (2013.01); *H01L 33/387* (2013.01); *H01L 33/50* (2013.01)

(58) Field of Classification Search
CPC ....... H01L 33/08; H01L 33/12; H01L 33/387; H01L 33/50
See application file for complete search history.

(56) References Cited

U.S. PATENT DOCUMENTS 9,985,175 B1 * 5/2018 Yoo ........................ H01L 27/156

* cited by examiner

*Primary Examiner* — Ali Alavi
(74) *Attorney, Agent, or Firm* — Mei & Mark LLP

(57) ABSTRACT

An LED panel is disclosed. The LED panel includes LED chips and a mount substrate on which the LED chips are mounted by flip bonding. Each of the LED chips includes a sapphire substrate, a plurality of light emitting cells disposed below the sapphire substrate, and an etched portion formed between the plurality of light emitting cells. Each of the LED chips includes a plurality of color cells formed corresponding to the plurality of light emitting cells on the sapphire substrate to change or maintain the color of light from the corresponding light emitting cells and a plurality of light collecting portions formed corresponding to the plurality of light emitting cells and the plurality of color cells on the bottom surface of the substrate and adapted to collect light from the corresponding light emitting cells on the corresponding color cells.

20 Claims, 7 Drawing Sheets

LED PANEL

This is a continuation of application Ser. No. 15/857,544, filed Dec. 28, 2017, which is incorporated herein by reference.

BACKGROUND OF THE INVENTION

1. Field of the Invention

The present invention relates to an LED panel, and more specifically to an LED panel including a plurality of color cells formed on a sapphire substrate and constructed such that light from light emitting cells is collected on the corresponding color cells, thus being suitable for use in a micro-LED display. The term "color cell" as used herein refers to a cell in which light from a light emitting cell undergoes wavelength conversion to change its color or through which light from a light emitting cell is transmitted without wavelength conversion while maintaining its color.

2. Description of the Related Art

Proposals have been made on techniques wherein micro-LED chips, each of which includes a plurality of light emitting cells having a size ranging from several to several tens of micrometers (μm) and arrayed in a matrix, are mounted on an active matrix substrate as a mount substrate to construct a micro-LED panel and a micro-LED display is fabricated using the micro-LED panel. According to conventional techniques using wire bonding, it is difficult to connect LED chips to an active matrix substrate such that a plurality of light emitting cells having a size ranging from several to several tens of μm are individually controllable. In contrast, flip-bonding techniques are very advantageous in mounting micro-LED chips on an active matrix substrate such that a plurality of light emitting cells having a size ranging from several to several tens of μm are individually controllable. In such micro-LED chips, the plurality of light emitting cells are formed by etching a GaN epilayer grown on a sapphire substrate. Thus, the light emitting cells emit light of the same wavelength, making it difficult to apply the micro-LED chips to RGB full-color micro-LED displays. As a solution to this difficulty, it is possible to consider the array of a plurality of light emitting cells below a sapphire substrate and the formation of a plurality of color cells including wavelength converting materials on the sapphire substrate and corresponding to the plurality of light emitting cells.

In this case, however, light emitted upward from the light emitting cells is dispersed in the sapphire substrate before the corresponding color cells are reached, losing its light efficiency and causing unwanted light mixing or interference between the adjacent light emitting cells.

SUMMARY OF THE INVENTION

Therefore, the present invention has been made in an effort to solve the above problems and it is an object of the present invention to provide an LED panel including LED chips, each of which includes a plurality of light emitting cells arrayed below a sapphire substrate and a plurality of color cells formed on the sapphire substrate and in which light from the light emitting cells undergoes wavelength conversion or through which light from each of the light emitting cells is transmitted without wavelength conversion and constructed such that light from the light emitting cells can be effectively collected on the corresponding color cells.

An LED panel according to one aspect of the present invention includes: LED chips, each of which includes a sapphire substrate, a plurality of light emitting cells disposed below the sapphire substrate, and an etched portion formed between the plurality of light emitting cells; and a mount substrate on which the LED chips are mounted by flip bonding, wherein each of the LED chips includes a plurality of color cells formed corresponding to the plurality of light emitting cells on the sapphire substrate to change or maintain the color of light from the corresponding light emitting cells and a plurality of light collecting portions formed corresponding to the plurality of light emitting cells and the plurality of color cells on the bottom surface of the substrate and adapted to collect light from the corresponding light emitting cells on the corresponding color cells.

According to one embodiment, each of the plurality of light collecting portions includes a reflection plane formed in an area of the bottom surface of the overlying sapphire substrate vertically corresponding to the etched portion.

According to one embodiment, the reflection plane may be gradually flared along the thickness direction of the sapphire substrate from the bottom surface of the sapphire substrate.

According to one embodiment, the reflection plane may be gradually tapered along the thickness direction of the sapphire substrate from the bottom surface of the sapphire substrate.

According to one embodiment, each of the plurality of light collecting portions may include a lens profile formed in an area of the bottom surface of the overlying sapphire substrate vertically corresponding to the corresponding light emitting cell to collect light from the light emitting cell on the corresponding color cell.

According to one embodiment, the lens profile may be formed by patterning the bottom surface of the sapphire substrate.

According to one embodiment, the lens profile may further include a portion of a gallium nitride epilayer grown on the pattern.

According to one embodiment, the lens profile may further include a low refractive index material previously filled in the pattern before a gallium nitride epilayer is formed on the bottom surface of the sapphire substrate.

According to one embodiment, each of the plurality of light collecting portions includes a lens profile formed in an area of the bottom surface of the overlying sapphire substrate vertically corresponding to the corresponding light emitting cell and a reflection plane formed in an area of the bottom surface of the overlying sapphire substrate vertically corresponding to the etched portion.

According to one embodiment, the plurality of color cells may include groups of a first color cell, a second color cell, and a third color cell arranged adjacent to one another.

According to one embodiment, two or more of the first color cell, the second color cell, and the third color cell convert the wavelengths of light from the corresponding light emitting cells to output light of different colors.

According to one embodiment, the plurality of light emitting cells include a first light emitting cell, a second light emitting cell, and a third light emitting cell corresponding to the first color cell, the second color cell, and the third color cell, respectively, and emitting light of the same color; the first color cell receives light from the first light emitting cell, converts the received light into light of a first color, and emits the converted light; the second color cell receives light from the second light emitting cell, converts the received light into light of a second color different from the first color, and emits the converted light; and the third color cell receives light from the third light emitting cell and emits light of the same color.

According to one embodiment, the LED chip further includes a light shielding layer formed to cover the lateral sides of the plurality of color cells.

According to one embodiment, the LED chip further includes a passivation layer formed to cover the lateral sides of the plurality of light emitting cells.

According to one embodiment, the passivation layer includes a reflective material adapted to send light from the light emitting cells upward.

According to one embodiment, the sapphire substrate is cut for thickness reduction.

According to one embodiment, the LED chip includes an edge area surrounding the plurality of light emitting cells and an n-type area including the surface of an n-type semiconductor layer between the neighboring light emitting cells; and each of the plurality of light emitting cells includes an active layer and a p-type semiconductor layer sequentially formed on the bottom surface of the n-type semiconductor layer.

According to one embodiment, the LED chip includes a plurality of individual electrode pads individually connected to the p-type semiconductor layers of the plurality of light emitting cells and a common electrode pad connected to the n-type area and connected in common to the n-type semiconductor layer.

According to one embodiment, the mount substrate includes a plurality of CMOS cells corresponding to the plurality of light emitting cells, a plurality of first electrodes corresponding to the plurality of individual electrode pads, and a second electrode corresponding to the common electrode pad; and a plurality of solder materials connect between the plurality of individual electrode pads and the plurality of first electrodes and between the common electrode pad and the second electrode.

In the LED panel of the present invention, the plurality of light collecting portions formed on the bottom surface of the sapphire substrate are arranged corresponding to the plurality of overlying color cells and the plurality of underlying light emitting cells. With this arrangement, light from the light emitting cells can be effectively collected on the corresponding color cells. Particularly, the LED panel of the present invention is constructed to minimize light mixing and interference between the neighboring light emitting cells in the sapphire substrate. In addition, the LED panel of the present invention is constructed to minimize the scattering or absorption of light in the sapphire substrate, contributing to an increase in light extraction efficiency.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. The drawings and the embodiments are simplified and exemplified such that those skilled in the art can readily understand the present invention, and therefore they should not be construed as limiting the scope of the present invention.

Figure 1:
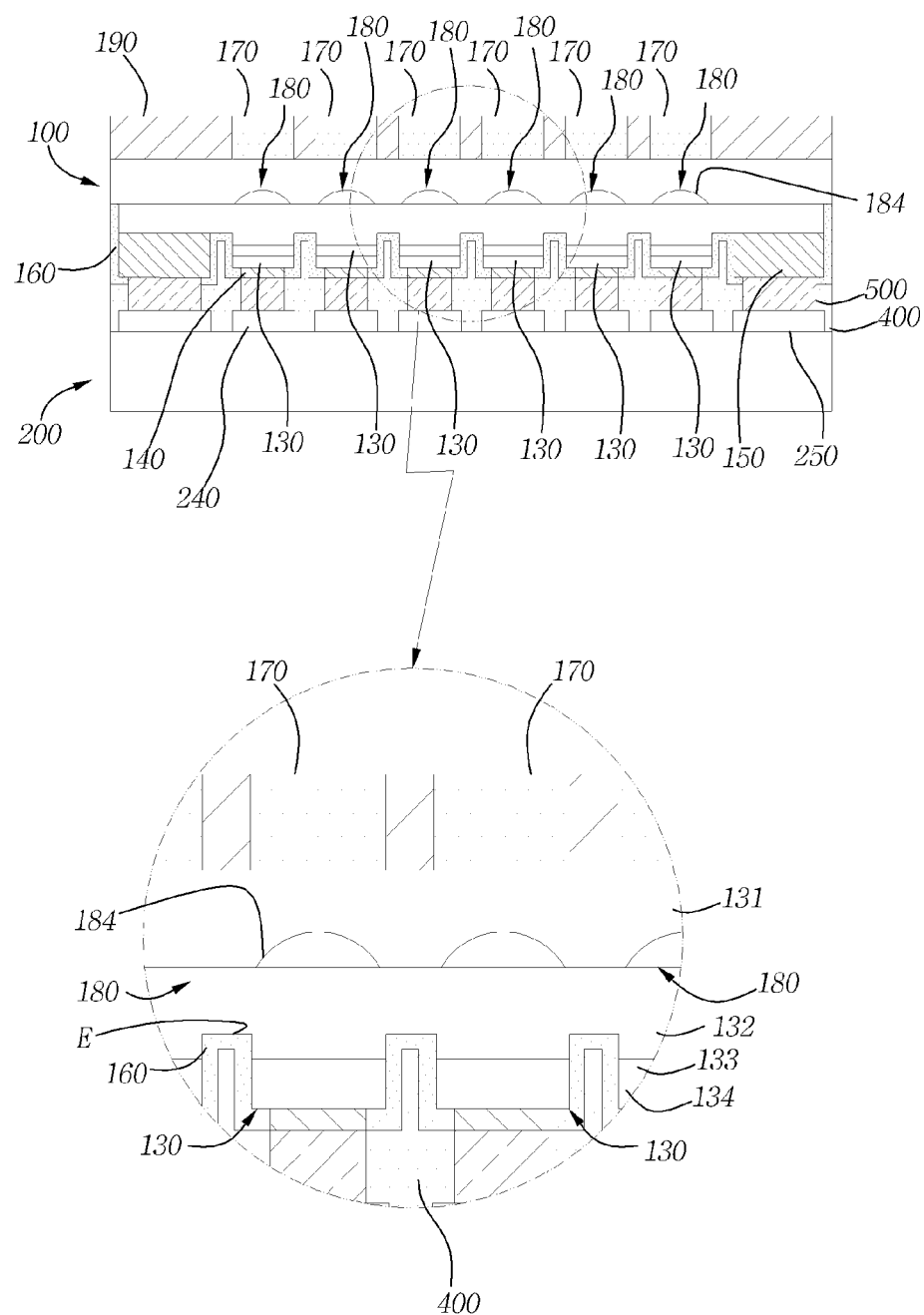
FIG. 1 is a cross-sectional view illustrating an LED panel according to a first embodiment of the present invention.

Referring to FIG. 1, an LED panel according to a first embodiment of the present invention includes: an LED chip 100 including a plurality of light emitting cells 130 arrayed in a matrix; and a mount substrate 200 on which the LED chip 100 is mounted by flip bonding. The LED panel includes a plurality of electrode pads 140 and 150 provided in the LED chip 100 and a plurality of electrodes 240 and 250 disposed in the mount substrate 200 and connected to the electrode pads 140 and 150, respectively.

The plurality of light emitting cells 130 of the LED chip 100 are arrayed in a matrix below a light transmitting sapphire substrate 131. A buffer layer (not illustrated) may be formed between the sapphire substrate 131 and the plurality of light emitting cells 130. Here, the sapphire substrate 131 is reduced in thickness to minimize dispersion and scattering of light from the light emitting cells 130 in the sapphire substrate 131. It is preferred that a portion of the upper or lower surface of the sapphire substrate 131 is cut off for thickness reduction. That is, the sapphire substrate 131 above which the plurality of light emitting cells 130 are disposed has a thickness of 250 to 400 μm and its thickness is reduced to 80 to 120 μm by subsequent processing. The thickness of the plurality of light emitting cells 130 is ~5±2 μm corresponding to ±5% of the thickness of the sapphire substrate 131.

Each of the light emitting cells 130 at least includes an active layer 133 and a p-type semiconductor layer 134 sequentially formed below the sapphire substrate 131, i.e. on the bottom surface of the buffer layer or on the bottom surface of an n-type semiconductor layer 132. In each of the light emitting cells 130, the active layer 133 is interposed between the n-type semiconductor layer 132 and the p-type semiconductor layer 134. The buffer layer is optional and does not need to be provided. Various types of layers may be formed between the n-type semiconductor layer 132 and the active layer 133 and between the active layer 133 and the p-type semiconductor layer 134. The plurality of light emitting cells 130 are formed by sequentially growing the gallium nitride buffer layer, the n-type semiconductor layer 132, the active layer 133, and the p-type semiconductor layer 134 on the sapphire substrate 131 and removing portions of the active layer 133 and the p-type semiconductor layer 134 by a suitable process such as etching to expose some areas of the n-type semiconductor layer 132 hidden by the active layer 133 and the p-type semiconductor layer 134. As a result, an n-type area having the surface of the n-type semiconductor layer is formed at a circumferential edge surrounding the light emitting cells 130 and in trenches formed between the neighboring light emitting cells 130. The n-type area includes an etched portion E surrounding the plurality of light emitting cells 130.

The LED chip 100 includes a monolayer or multilayer insulating passivation layer 160 formed so as to cover the plurality of light emitting cells 130 and the n-type area having the surface of the n-type semiconductor layer 132. The passivation layer 160 includes a plurality of bonding holes through which the electrode pads 140 and 150 are exposed. The plurality of bonding holes include a plurality of first bonding holes through which the p-type electrode pads 140 are exposed and a second bonding hole through which the n-type electrode pad 150 is exposed. Particularly, a portion of the passivation layer 160 surrounds the lower sides and lateral sides of the light emitting cells 130 except for the bonding holes. The passivation layer 160 is made of a reflective material. In this case, the passivation layer 160 includes a reflective layer (not illustrated) to reflect light from the plurality of light emitting cells 130 toward the sapphire substrate 131. When the reflective layer uses a conductive material, the passivation layer has an insulating layer-reflective layer-insulating layer structure. Alternatively, the reflective layer may use a non-conductive material. In this case, the passivation layer has a reflective layer-insulating layer structure. The conductive material and the non-conductive material may be used individually or as a mixture.

The reflective layer serves to reflect light from the active layer 133 and send the reflected light upward. The bonding holes may be filled with bonding members (such as solder bumps) made of a conductive reflective material. The bonding members, together with the passivation layer 160, serve to reflect light from the active layer 133 of the light emitting cells 130 and send the reflected light upward, which will be explained hereinafter.

The mount substrate 200 is preferably an active matrix substrate including a plurality of CMOS cells (not illustrated) corresponding to the plurality of light emitting cells 130 provided in the LED chip 100 and a plurality of electrodes 240 and 250 corresponding to the electrode pads of the LED chip 100. The plurality of electrodes 240 and 250 of the mount substrate 200 correspond to the electrode pads of the LED chip 100. The electrode pads 140 and 150 are individually connected to the electrodes 240 and 250 through bonding members 500 such as solder bumps. The first electrode pads 140 are formed corresponding to the light emitting cells 130 and the second electrode pad 150 is connected to the n-type area surrounding the plurality of light emitting cells 130 and including the surface of the n-type semiconductor layer 132. The first electrode pads 140 are individual electrode pads individually connected to the p-type semiconductor layers 134 of the light emitting cells 130 and the second electrode pad 150 is a common electrode pad connected to the common n-type semiconductor layer of the plurality of light emitting cells 130.

In one embodiment of the present invention, the LED chip 100 includes a plurality of color cells 170 arrayed in a matrix on the upper surface of the sapphire substrate 131. The plurality of color cells 170 correspond to the plurality of light emitting cells 130. More specifically, each of the plurality of color cells 170 is formed at a vertical position above the corresponding light emitting cell 130. Each of the plurality of color cells 170 converts light of the same color, most preferably blue light, from the corresponding light emitting cell 130 into light of a predetermined color and outputs the light of the predetermined color upward. The plurality of light emitting cells 130 may all emit blue light. In this case, the plurality of color cells 170 may include a red color cell converting the wavelength of blue light to the wavelength of red light, a green color cell converting the wavelength of blue light to the wavelength of green light, and a blue color cell outputting blue light without wavelength conversion. The red color cell, the green color cell, and the blue color cell are close to one another and arranged in one group to define a particular pixel of a display.

The LED chip 100 includes a plurality of light collecting portions 180 formed on the bottom surface of the sapphire substrate 131. The light collecting portions 180 are arranged corresponding to the plurality of underlying light emitting cells 130 and the plurality of overlying color cells 170. Each of the plurality of light collecting portions 180 serves to collect light from the corresponding light emitting cell 130 on the corresponding color cell 170.

As an example, blue light emitted from one of the three light emitting cells 130 arranged in one group is collected on the red color cell of the neighboring three color cells 170 through the light collecting portion 180 corresponding to the light emitting cell 130, the wavelength of the blue light is converted to the wavelength of red light by the red color cell, and the red light is emitted to the outside; blue light from another one of the three neighboring light emitting cells 103 is collected on the green color cell of the neighboring three color cells 170 through the light collecting portion 180 corresponding to the light emitting cell 130, the wavelength of the blue light is converted to the wavelength of green light by the green color cell, and the green light is emitted to the outside; and blue light from the remaining one of the three neighboring light emitting cells 103 is collected on the blue color cell of the neighboring three color cells 170 through the light collecting portion 180 corresponding to the light emitting cell 130 and is emitted to the outside without wavelength conversion.

In this embodiment, each of the plurality of light collecting portions 180 is designed to focus or concentrate light onto the corresponding color cell 170 by its lens structure. For this design, each of the plurality of light collecting portions 180 includes a lens profile 184. The constituent gallium nitride epilayer of the light emitting cells may be used for the lens profiles 184. Alternatively, the lens profiles 184 may be formed using a low refractive index material, more preferably a material having a lower refractive index than sapphire that has the ability to collect light on the color cells 170 according to the Snell's law and in concert with the shape of the lens profiles. In the former case, the bottom surface of the sapphire substrate 131 is patterned to form a plurality of lens profile 184 and the epilayer is formed thereon. In the latter case, the bottom surface of the sapphire substrate 131 is patterned to form a plurality of lens profile 184, a light-transmitting material with a low refractive index is filled in the plurality of lens profiles 184, and the epilayer is formed thereon. The pattern of the sapphire substrate 131 for the formation of the lens profiles 184 may include recesses whose cross-section is hemispherical, domed, elliptical, V-shaped, inverted V-shaped, trapezoidal or inverted trapezoidal in shape.

The LED chip 100 may further include a light shielding layer 190 formed to cover the lateral sides of the plurality of color cells 170. The light shielding layer 190 is formed using a light absorbing material to prevent light mixing and interference between the neighboring color cells 170. The light absorbing material may be, for example, a black ink or resin. The light shielding layer 190 includes a plurality of cell holes arranged in a matrix. The holes are formed in contact with the upper surface of the sapphire substrate 131 and are filled with the corresponding color cells 170.

In addition, an insulating underfill material 400 may be filled between the LED chip 100 and the mount substrate 200.

Figure 2:
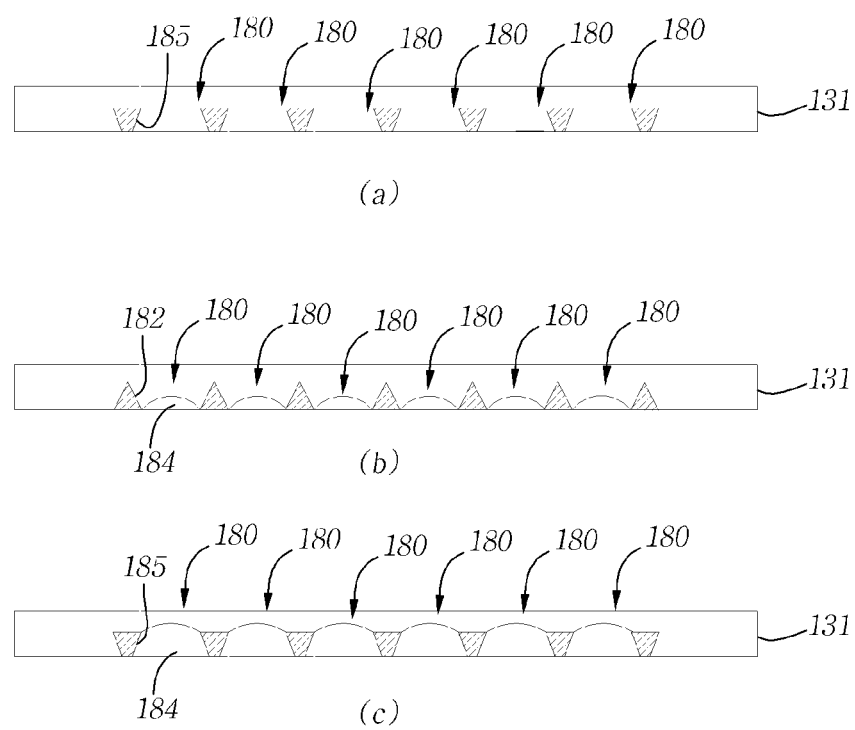
FIG. 2 explains various shapes of light collecting portions.

Other shapes of light collecting portions different from the shapes of the light collecting portions in the first embodiment of the present invention and the subsequent second embodiment of the present invention may also be considered. FIG. 2 explains various shapes of the light collecting portions.

Each of the light collecting portions 180 illustrated in (a) of FIG. 2 has a reflection plane 185 that is gradually tapered along the thickness direction of the sapphire substrate 131 from the bottom surface of the sapphire substrate 131. Each of the light collecting portions 180 illustrated in (b) of FIG. 2 includes a lens profile 184 for light collection and an upwardly flared reflection plane 182 formed around the lens profile 184. Each of the light collecting portions 180 illustrated in (c) of FIG. 2 includes a lens profile 184 for light collection and an upwardly tapered reflection plane 185 formed around the lens profile 184. Here, the upwardly tapered reflection planes 185 and the upwardly flared reflection planes 182 are formed at vertical positions above the etched portion E surrounding the periphery of the light emitting cells 130. Here, the etched portion E refers to a portion of the epilayer that is removed by etching to at least form the light emitting cells, as mentioned briefly above.

Figure 3:
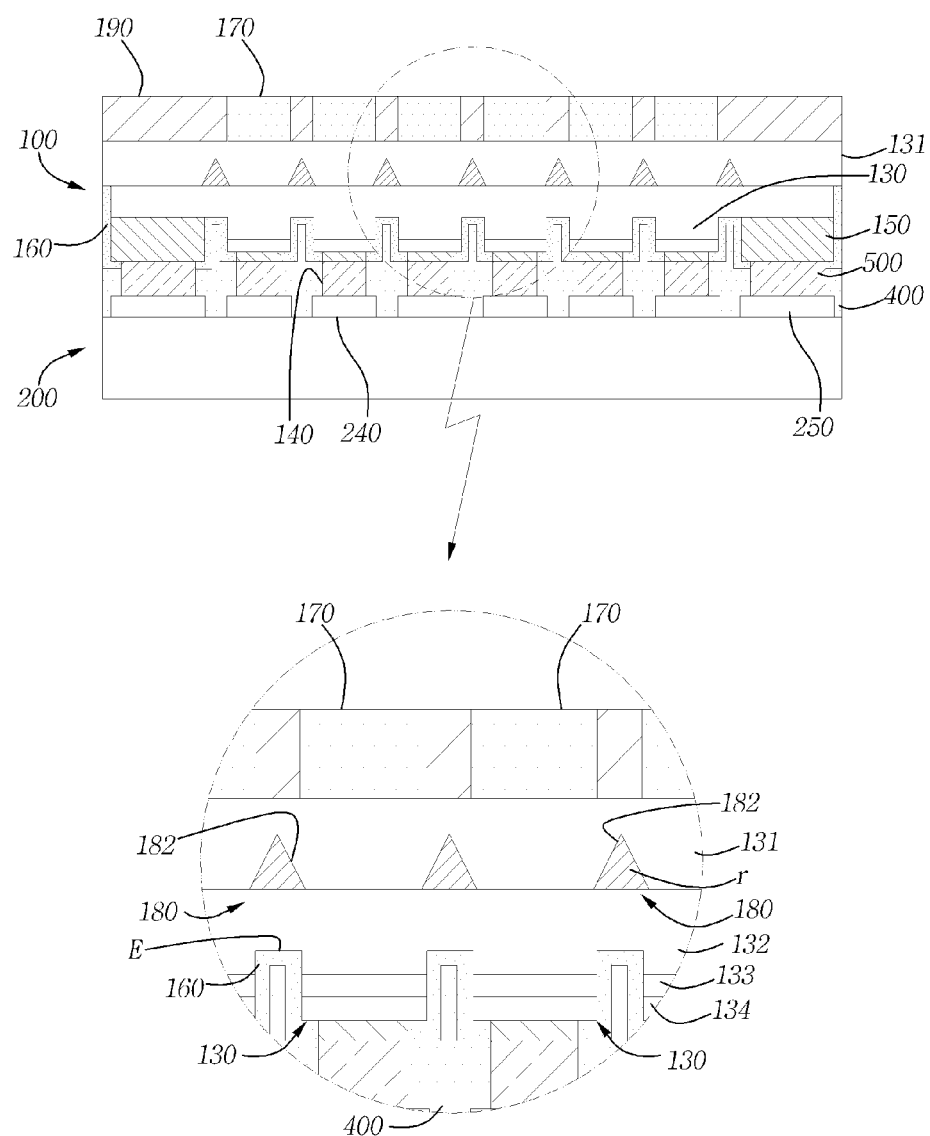
FIG. 3 is a cross-sectional view illustrating an LED panel according to a second embodiment of the present invention.

Referring to FIG. 3, an explanation will be given of an LED panel according to a second embodiment of the present invention.

In this embodiment, an LED chip 100 includes a plurality of light collecting portions 180 formed on the bottom surface of a sapphire substrate to correspond to a plurality of underlying light emitting cells 130 and a plurality of overlying color cells 170. Like in the previous embodiment, each of the plurality of light collecting portions 180 serves to collect light from the corresponding light emitting cell 130 on the corresponding color cell 170.

In this embodiment, the plurality of light collecting portions 180 may be formed by patterning the bottom surface of the sapphire substrate 131 to form recesses whose cross-section is V-shaped, inverted V-shaped, trapezoidal, inverted trapezoidal, hemispherical, domed or elliptical in shape, and filling a reflective material r in the pattern. Each of the plurality of light collecting portions 180 includes a reflection plane 182 formed at a vertical position above the corresponding light emitting cell 130. In this embodiment, each of the reflection planes 182 is gradually flared along the thickness direction of the sapphire substrate 131 from the bottom surface of the sapphire substrate 131. Alternatively, the reflection planes 185 may be gradually tapered along the thickness direction of the sapphire substrate 131 from the bottom surface of the sapphire substrate 131. The upwardly tapered reflection planes 185 and the upwardly flared reflection planes 182 are formed at vertical positions above the etched portion E surrounding the periphery of the light emitting cells 130.

The construction of the LED panel according to the second embodiment of the present invention may be the same as that of the LED panel according to the first embodiment except for the specific structure of the light collecting portions, and a description thereof is omitted to avoid duplication.

Now, a method for constructing the LED panel according to the second embodiment of the present invention will be explained with reference to FIGS. 4 to 13.

Figure 4:
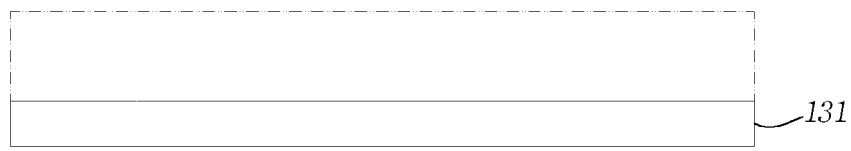
FIGS. 4 to 13 explain a method for constructing the LED panel illustrated in FIG. 3.
Figure 5:
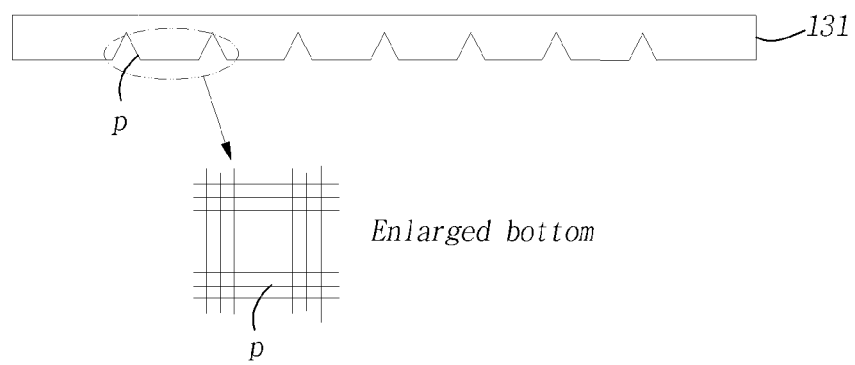
Figure 6:
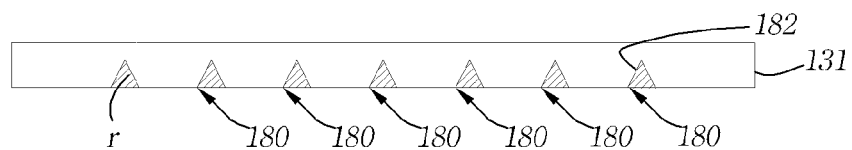

Referring first to FIGS. 4, 5, and 6, a portion of the upper or lower surface of a sapphire substrate 131 is cut off to reduce the thickness of the sapphire substrate 131. A grid pattern p having V-shaped recesses whose cross-section is V-shaped is on the sapphire substrate 131. A reflective material r is filled in the pattern p to form a plurality of light collecting portions 180, each of which includes a reflection plane 182 surrounding a plurality of reflecting areas. In these drawings, the sapphire substrate 131 is reduced in thickness before the formation of light emitting cells. However, it should be noted that a subsequent process may be carried out to reduce the thickness of the sapphire substrate 131 after formation of an epilayer or light emitting cells.

Figure 7:
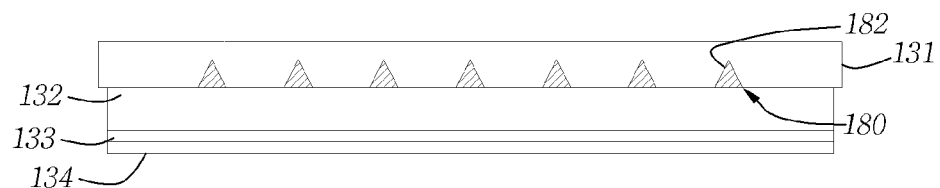
Figure 8:
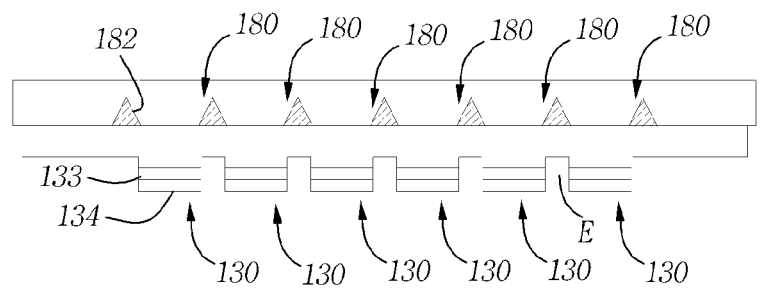

Referring next to FIGS. 7 and 8, an epilayer including an n-type semiconductor layer 132, an active layer 133, and a p-type semiconductor layer 134 is formed on the bottom surface of the sapphire substrate 131 so as to cover the plurality of light collecting portions 180 and is then etched to form a plurality of light emitting cells 130, each of which at least includes the active layer 133 and the p-type semiconductor layer 134 on an n-type area including the surface of the n-type semiconductor layer 132. Here, the plurality of light emitting cells 130 are formed corresponding to the plurality of light collecting portions 180. As mentioned previously, each of the reflection planes 182 of the plurality of light collecting portions 180 is formed at a vertical position above the corresponding light emitting cell 130.

Figure 9:
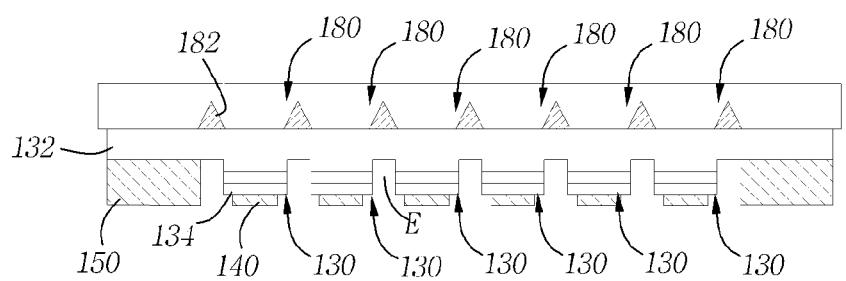
Figure 10:
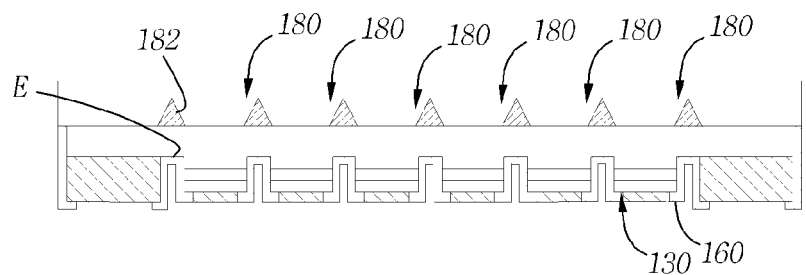

Referring next to FIGS. 9 and 10, a first electrode pad 140 as an individual electrode pad is formed on a p-type semiconductor layer 134 of each of the plurality of light emitting cells 130 and a second electrode pad 150 as a common electrode pad is formed on the n-type semiconductor layer 132 in an n-type edge area surrounding the plurality of light emitting cells 130. Then, a passivation layer 160 is formed to cover the lateral sides and portions of the bottom surfaces of the plurality of light emitting cells 130. The passivation layer 160 is preferably formed using a reflective material.

Figure 11:
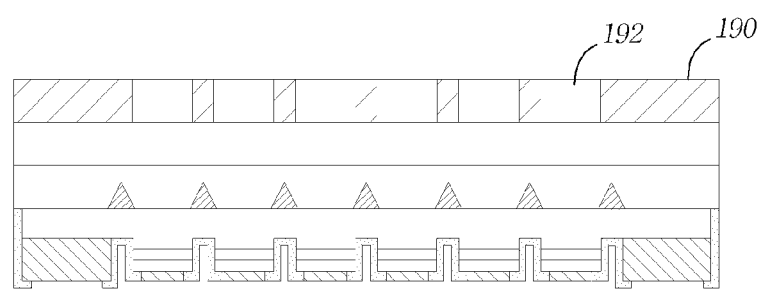
Figure 12:
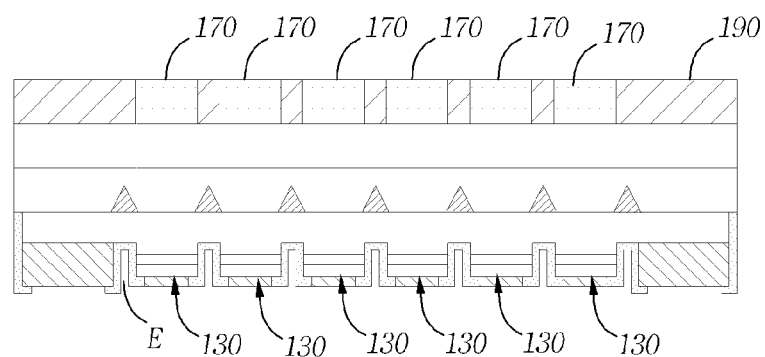

Referring next to FIGS. 11 and 12, a grid light shielding layer 190 including a plurality of cell holes 192 is formed using a black ink or resin on the upper surface of the sapphire substrate 131. Thereafter, wavelength converting light transmitting materials and/or a non-wavelength converting light transmitting material is filled in the plurality of cell holes 192 to form a plurality of color cells 170. The plurality of color cells 170 are formed corresponding to the plurality of light emitting cells 130. Each of the plurality of color cells 170 is formed at a vertical position above the corresponding light emitting cell 130.

Figure 13:
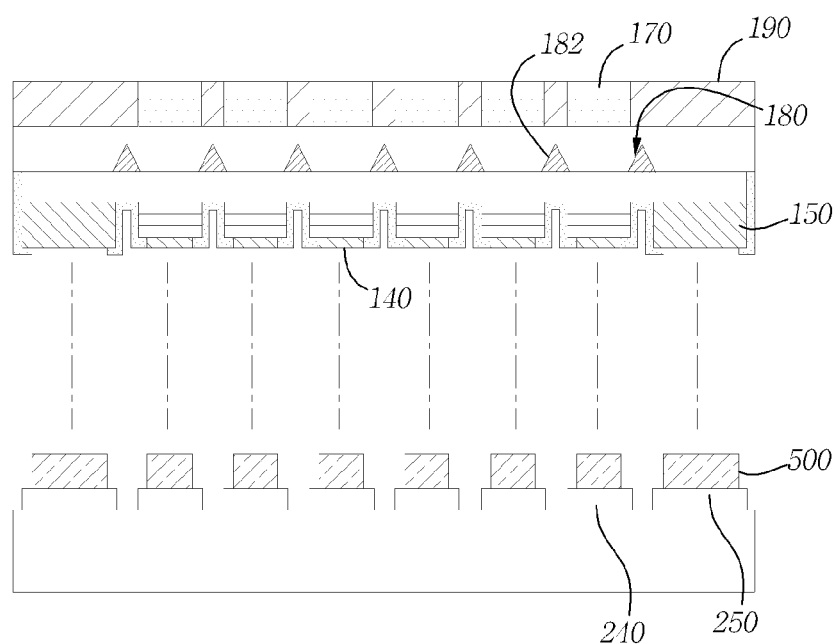

Referring next to FIG. 13, the LED chip 100 is mounted on a mount substrate 200 through bonding members 500 (such as solder bumps) by flip bonding such that the first electrode pads 140 and the second electrode pad 150 of the LED chip 100 are connected to first electrodes 240 and a second electrode 250 of the mount substrate 200, respectively.

The only difference between the method for constructing the LED panel according to the second embodiment and a method for constructing the LED panel according to the first embodiment is whether the light collecting portions include reflection planes or lens profiles, and a description thereof is omitted to avoid duplication.

As already explained in detail, the LED panels including a plurality of light emitting cells 130 arrayed in a matrix can be applied to LED displays. Alternatively, it should be noted that the LED panels may be cut or singulated into units including one or more light emitting cells 130, which may be used as individual LED devices or individual LED packages.

What is claimed is:
1. An LED panel comprising LED chips and a mount substrate on which the LED chips are mounted wherein each of the LED chips comprises a substrate having a patterned surface, a plurality of light collecting portions, each of which comprises a reflection plane formed on the pattern, and a plurality of light emitting cells which are formed from an epilayer formed on the substrate to cover the plurality of light collecting portions and each of which comprises an active layer and a p-type semiconductor layer on an n-type area comprising the surface of an n-type semiconductor layer, and wherein the plurality of light emitting cells are formed corresponding to the plurality of light collecting portions.

2. The LED panel according to claim 1, wherein the reflection plane of each of the light collecting portions is formed at a vertical position above the corresponding light emitting cell.

3. The LED panel according to claim 1, wherein a first electrode pad is formed on the p-type semiconductor layer of each of the plurality of light emitting cells and a second electrode pad is formed on the n-type semiconductor layer in an n-type edge area surrounding the plurality of light emitting cells.

4. The LED panel according to claim 3, further comprising a passivation layer formed to cover the lateral sides of the plurality of light emitting cells.

5. The LED panel according to claim 1, wherein the pattern comprises recesses whose cross-section is V-shaped.

6. The LED panel according to claim 1, further comprising a plurality of color cells formed on the surface of the substrate opposite the patterned surface thereof and corresponding to the plurality of light emitting cells.

7. The LED panel according to claim 6, wherein the LED chip further comprises a light shielding layer comprising a plurality of cell holes on the surface of the substrate opposite the patterned surface thereof and light transmitting materials filled in the plurality of cell holes, and wherein the light transmitting materials comprise wavelength converting light transmitting materials.

8. The LED panel according to claim 6, wherein the plurality of color cells comprise groups of a first color cell, a second color cell, and a third color cell arranged adjacent to one another and two or more of the first color cell, the second color cell, and the third color cell convert the wavelengths of light from the corresponding light emitting cells to output light of different colors.

9. The LED panel according to claim 1, wherein each of the plurality of light collecting portions comprises a lens profile formed to collect light from the corresponding light emitting cell on the corresponding color cell and comprising a portion of a gallium nitride epilayer grown on the pattern formed on the bottom surface of the substrate.

10. The LED panel according to claim 9, wherein the lens profile further comprises a low refractive index material previously filled in the pattern before a gallium nitride epilayer is formed on the bottom surface of the substrate.

11. The LED panel according to claim 1, wherein the reflection planes are formed by filling a reflective material in the pattern.

12. The LED panel according to claim 1, wherein the plurality of light emitting cells are defined by an etched portion.

13. The LED panel according to claim 1, wherein the reflection planes are formed by filling a reflective material in the pattern and the plurality of light emitting cells are defined by an etched portion.

14. The LED panel according to claim 13, wherein the reflective material corresponds to the etched portion.

15. The LED panel according to claim 14, wherein the reflection planes are formed at vertical positions above the etched portion.

16. The LED panel according to claim 1, wherein the plurality of light emitting cells are defined by an etched portion and the reflection planes formed on the pattern of the substrate correspond to the etched portion.

17. A method for producing an LED panel comprising preparing LED chips and mounting the LED chips on a mount substrate wherein the LED chips are prepared by providing a substrate having a first surface and a second surface opposite to each other, patterning the first surface of the substrate, and filling a reflective material in the pattern to form a plurality of light collecting portions, each of which comprises a reflection plane surrounding a plurality of reflecting areas, and wherein an epilayer comprising an n-type semiconductor layer, an active layer, and a p-type semiconductor layer is formed on the first surface of the substrate so as to cover the plurality of light collecting portions and is etched to form a plurality of light emitting cells, each of which at least comprises the active layer and the p-type semiconductor layer on an n-type area comprising the surface of the n-type semiconductor layer, such that the plurality of light emitting cells correspond to the plurality of light collecting portions.

18. The method according to claim 17, wherein each of the plurality of light collecting portions comprises a reflection plane formed at a vertical position above the corresponding light emitting cell.

19. The method according to claim 17, wherein a plurality of color cells corresponding to the plurality of light emitting cells are formed on the second surface of the substrate.

20. The method according to claim 19, wherein the plurality of color cells are formed by forming a light shielding layer comprising a plurality of cell holes on the second surface of the substrate and filling wavelength converting light transmitting materials and/or a non-wavelength converting light transmitting material in the plurality of cell holes.

* * * * *